United States Patent [19]

Mitzlaff

[11] Patent Number: 4,717,884
[45] Date of Patent: Jan. 5, 1988

[54] HIGH EFFICIENCY RF POWER AMPLIFIER

[75] Inventor: James E. Mitzlaff, Carpentersville, Ill.

[73] Assignee: Motorola, Inc., Schaumburg, Ill.

[21] Appl. No.: 852,045

[22] Filed: Apr. 14, 1986

[51] Int. Cl.$^4$ .......................... H03F 3/217; H03F 3/60
[52] U.S. Cl. ..................................... 330/251; 330/277; 330/286
[58] Field of Search ................ 330/53, 56, 192, 207 A, 330/251, 277, 286, 306, 307

[56] References Cited

U.S. PATENT DOCUMENTS

| | | | |
|---|---|---|---|
| 3,430,157 | 2/1969 | Wood | 330/192 |
| 3,437,931 | 4/1969 | Schultz, Jr. | 330/192 X |
| 3,662,294 | 5/1972 | Jacobs et al. | 333/33 |
| 3,900,823 | 8/1975 | Sokal et al. | 330/149 |
| 3,919,656 | 11/1975 | Sokal et al. | 330/51 |
| 4,189,682 | 2/1980 | Sechi | 330/277 |
| 4,350,958 | 9/1982 | Pagnamenta | 330/286 |
| 4,367,443 | 1/1983 | Hull et al. | 330/207 P |
| 4,504,796 | 3/1985 | Igarashi | 330/286 |

OTHER PUBLICATIONS

Sokal et al. "Class E-A New Class of High-Efficiency Tuned Single-Ended Switching Power, Amplifiers," *IEEE Journal of Solid-State Circuits*, vol. SC-10, No. 3, Jun. 1975, pp. 168-176.
K. Chiba et al.-"GaAs FET Power Amplifier Module with High Efficiency"—Electronics Letters, Nov. 24, 1983, pp. 1025-1026.
A. Tam—"Network Building Blocks Balance Power Amp Parameters"—Microwaves & RF, Jul. 1984, pp. 81-87.
R. Hejhall—"VHF MOS Power Applications'-'—Motorola RF Device Data, Third Edition, Application Note AN-878, 1983, pp. 3-75, 78.
H. Kraus—Solid State Radio Engineering, John Wiley and Sons—1980, pp. 448-458.
S. Wemple et al.—"Relationship Between Power Added Efficiency and Gate-Drain Avalanche in GaAs M.E.S.F.E.T.s" Electronic Letters, vol. 16, No. 12, Jun. 5, 1988, pp. 459-460.
F. Sechi—"High Efficiency Microwave FET Power Amplifiers"—Microwave Journal, Nov., 1981, pp. 59-63.
F. Raab—"High Efficiency Amplification Techniques'-'—IEEE Circuits and Systems (Newsletter), vol. 7, No. 10, pp. 3-11, Dec., 1975.
F. Raab—"FET Power Amplifier Boosts Transmitter Efficiency"—Electronics, vol. 49, No. 12, pp. 122-126, Jun. 10, 1976.
N. Sokal et al.—"Class E Switching Mode RF Power Amplifiers—Low Power Dissipation, Low Sensitivity to Component Tolerances (including transistors) and Well-Defined Operation"-IEEE Elector Conference, Session 23, Apr. 25, 1979.
N. Fuzik et al.—"Electrical Design of the Oscillatory Circuits of the Final Stage of a Radio Transmitter Operating in a Biharmonic Mode"—Radio Engineering, vol. 25, No. 1, 1970, p. 141.

(List continued on next page.)

*Primary Examiner*—James B. Mullins
*Attorney, Agent, or Firm*—Raymond A. Jenski; Rolland R. Hackbart

[57] ABSTRACT

A high efficiency RF power amplifier is disclosed in which a field effect transistor is operated in a class F mode. A third harmonic quarterwave open circuit transmission line stub having a $Z_O$ adjusted to provide capacitance series resonant with transistor inductance at the second harmonic is coupled to the transistor output lead to produce a low impedance at the channel drain of the transistor. Parallel resonance of the transistor die capacitance and interconnect inductance coupled to ground by the transmission line produces a third harmonic high impedance at the channel drain. Further lowpass output matching circuitry provides a constantly increasing impedance magnitude from the transistor die to the load and provides load mismatch isolation to the second and third harmonic impedances at the channel drain.

11 Claims, 12 Drawing Figures

OTHER PUBLICATIONS

N. Fuzik—"Biharmonic Modes of a Tuned RF Power Amplifier"—Radio Engineering, vol. 25, No. 7, 1970, p. 117.

E. Glazman et al.—"Improving VHF Transmitter Efficiency by Using the Biharmonic Mode"—Telecommunications and Radio Engineering, Part 1, vol. 30, Jul., 1975, pp. 46–51.

V. Tyler—"A New High-Efficiency High Power Amplifier"—Marconi Review, vol. 21, 1958.

D. Snider—"A Theoretical Analysis and Experimental Confirmation of the Optimally Loaded and Overdriven RF Power Amplifier"—IEEE Transactions on Electron Devices, vol. ED-14, No. 12, Dec., 1967.

V. Stokes—*Radio Transmitters*—Van Nostrand Reinhold Co.—1970, pp. 167–175.

— PRIOR ART —

HIGH EFFICIENCY RF POWER AMPLIFIER

BACKGROUND OF THE INVENTION

This invention relates generally to high efficiency power amplifiers for radio frequency applications and more specifically to a solid state power amplifier circuit which realizes high efficiency conversion of supply power to radio frequency signal power by operating in a switched mode with control of fundamental and harmonic frequency impedance in the output circuit.

Traditional power amplification at radio frequencies has been achieved with thermionic and solid state devices operating in the range of their linear amplification characteristic or, where possible, in a combination of linear characteristic and cut-off characteristic. These operating ranges, while extremely useful, are not the most efficient at producing radio frequency (RF) output from applied signal and direct current (DC) supply power. A number of investigators have researched techniques for improving the input power to output power conversion efficiency and have concluded that optimum efficiency could be realized by operating the active device as a switch. This class of operation would cause the device to be in a saturated or cut-off condition most of the time and therefore dissipate as little power in an active region as possible.

Practical realization of high frequency switching operation, however, has been difficult to achieve due to finite switching times in the active device and device and package parasitic impedances. Increasing use of portable, battery powered, radio transmitters creates a significant demand that the efficiency of the power amplifier stage become as great as possible.

SUMMARY OF THE INVENTION

Therefore, it is one object of the present invention to realize a high efficiency RF power amplifier utilizing cut-off to saturation switching of active device voltage.

It is a further object of the present invention to control the amplitude of voltage appearing across the active device.

It is a further object of the present invention to create a short circuit impedance at the second harmonic of the frequency of operation and an open circuit impedance at the third harmonic of the operating frequency appearing at the active device.

It is a further object of the present invention to provide an impedance match between the active device die and a load at the fundamental frequency of operation such that the impedance magnitude continuously increases from device die to load thus yielding broadband operation.

It is a further object of the present invention to provide isolation of the respective short circuit and open circuit impedances at the second and third harmonics from changes which may occur at the load.

Accordingly, these and other objects are achieved in the present invention which encompasses a high efficiency RF power amplifier utilizing a semiconductor device in class F operation to limit the maximum voltage appearing at the output terminal of the semiconductor device die. A circuit configuration including device parasitic impedances creates a short circuit impedance at the second harmonic and an open circuit impedance at the third harmonic of the fundamental operating frequency appearing at the output of the device die. Additionally, an output circuit creates an increasing impedance magnitude value in matching the device die output to the load while isolating load mismatch at the second and third harmonics of the fundamental.

DETAILED DESCRIPTION OF THE PREFERRED EMBODIMENT

Radio frequency (RF) power amplifiers have been logically separated into various classifications based upon their mode of operation. These classifications have been alphabetized from class A to class F. Since it is the goal of the present invention to achieve high efficiency in RF amplification, classes A and B are not considered here because they operate in a mode which prefers amplification linearity rather than high efficiency.

Figure 1:
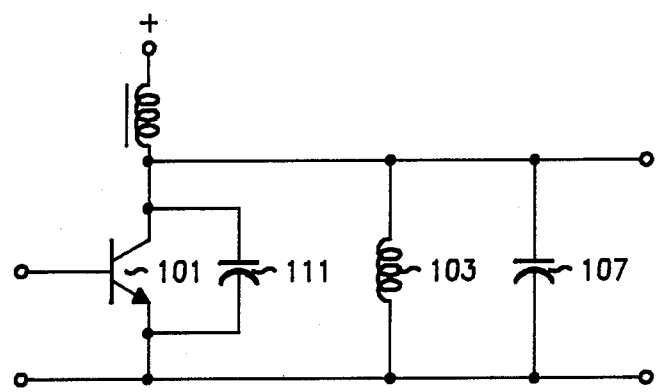
FIG. 1 is a schematic diagram of a conventional class C RF power amplifier.
Figure 2:
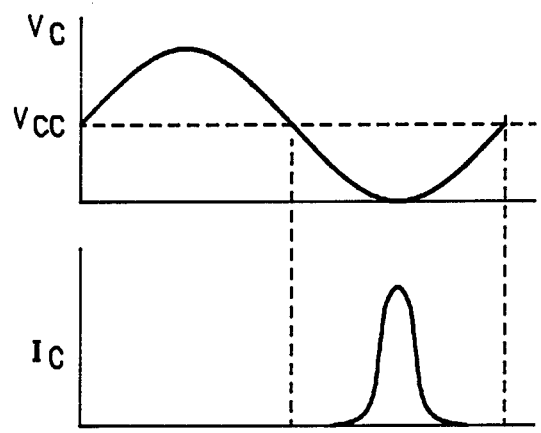
FIG. 2 is two graphs illustrating collector voltage and current versus time for the circuit of FIG. 1.

In a class C amplifier, shown in FIG. 1, the active device 101 is biased in the off condition such that a drive signal causes the active device 101 to conduct with a conduction angle less than 180 degrees. During this conduction, active device 101 essentially remains in a linear amplification mode. Class C operation is shown in the idealized wave forms of FIG. 2, where the relationship of collector voltage and collector current are shown. It can be seen, then, that the collector current flows only during the minimum collector voltage thereby resulting in a higher efficiency. (The device efficiency is defined to be the ratio of fundamental output power to DC input power). High efficiencies have been achieved with class C amplifiers by making the duty cycle of the current wave form arbitrarily small. In doing so, however the usable power also becomes arbitrarily small and the usefulness of the amplifier becomes limited.

Class C amplifiers typically excite a high Q output tank circuit tuned to the fundamental frequency and consisting of inductor 103 and capacitor 107 in FIG. 1. This tank circuit provides a low impedance to all harmonics of the fundamental frequency. The active device has an output capacitance 111, which in a semiconductor is die capacitance and which can be combined with tank capacitor 107 to resonate with inductor 103.

Class D amplifiers utilize a pair of transistors coupled in series but operating out of phase. Such a multiple active device circuit is not considered further here.

Figure 3:
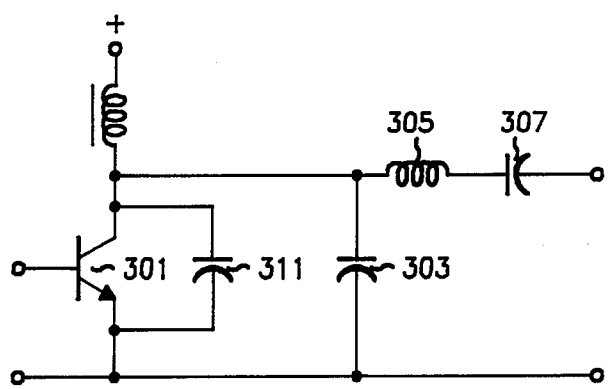
FIG. 3 is a schematic diagram of a conventional class E RF power amplifier.
Figure 4:
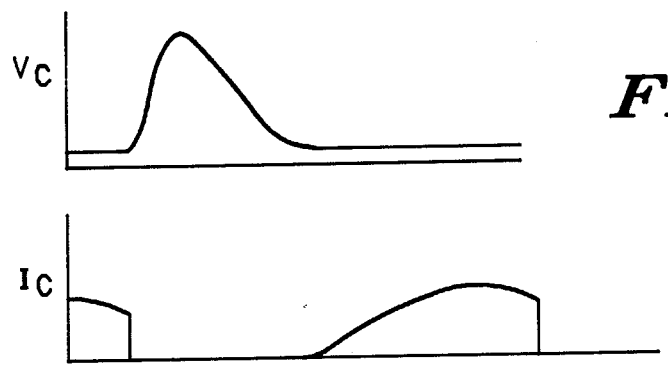
FIG. 4 comprises two graphs illustrating collector voltage and current versus time for the circuit of FIG. 3.

A class E circuit is shown in FIG. 3. This circuit design seeks to achieve minimal device dissipation by preventing a significant voltage from appearing across the active device 301 while current is flowing through it. The voltage and current waveforms shown in FIG. 4 illustrate proper conduction timing. Essentially, the phasing of voltage and current requires that the output network be designed such that as the active device 301 is switched to a "open" state, the collector voltage rises and then "rings" so that it returns to zero just prior to its transition to a closed state. This "ringing" action takes place as energy is interchanged between capacitor 303 and tuned circuit 305-307, which resonates slightly below the fundamental frequency. At a time when the voltage returns to near zero, the active device 301 is saturated. Thus as current flows there is essentially no voltage across the device. The relatively low resistance of the saturated device determines the dissipative losses which occur when current flows through it.

In order to avoid dissipating power at harmonics of the fundamental frequency, and to insure proper ringing action, it is necessary to provide a high impedance to harmonic currents by placing a lowpass filter in the output network. In the circuit of FIG. 3, the lowpass filter consists of inductor 305 and capacitor 307. These form a high Q series tuned circuit, resonating at a frequency slightly below the fundamental frequency.

Parasitic capacitor 311 effectively adds to the capacitance of external capacitor 303 as part of the ringing circuit. If overly large, it may limit the maximum frequency at which class E operation can be obtained. Note that there is no provision for an interconnect inductance between parasitic capacitor 311 and external capacitor 303. The reactance of this parasitic inductor must be negligible in comparison to the reactance of capacitors 303 and 311 in parallel, or the class E circuit will not function efficiently, as designed.

Class E amplifiers exhibit large voltage swings at the output of the active device, due to the above mentioned "ringing" action. This large voltage swing which typically exceeds three times the supply voltage, precludes the use of the class E circuit with certain active devices (such as a MESFET) which have a low output breakdown voltage. An active device should not be allowed to go into breakdown during output voltage peaks since this severely degrades device efficiency, and may damage the active device.

Figure 5:
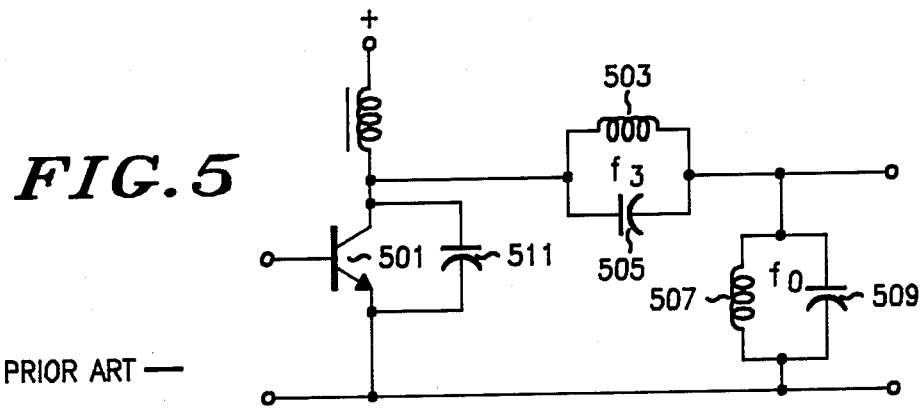
FIG. 5 is a schematic diagram of a conventional class F RF power amplifier using third harmonic peaking.
Figure 6:
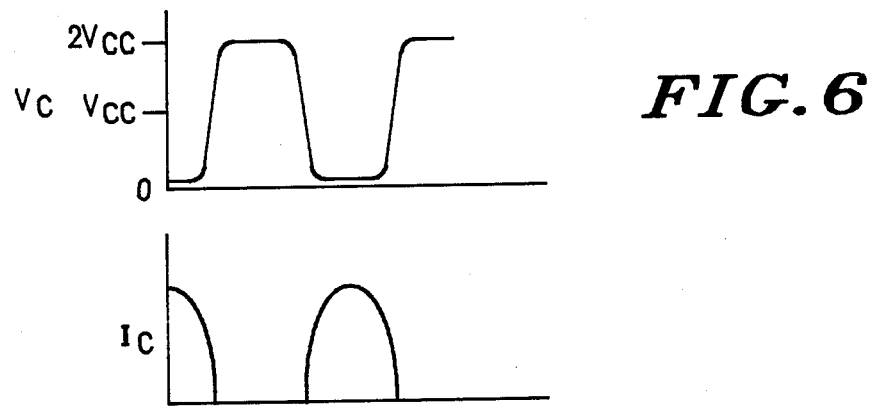
FIG. 6 comprises two graphs illustrating collector voltage and current versus time for the circuit of FIG. 5.

Class F amplification is well known, dating from early investigations of tube amplifiers (where it was termed "biharmonic" or "polyharmonic" mode). A simplified circuit diagram of one form of a class F amplifier is shown in FIG. 5 with attendant voltage and current waveforms shown in FIG. 6. In realizing a class F circuit, the active device operates primarily as a switch and the output network, generally, is designed to yield short circuit impedances at even harmonics of the fundamental frequency and to yield open circuit impedances at odd harmonics of the fundamental frequency.

The most efficient operation of a class F amplifier is realized when the collector voltage of transistor 501 is driven rapidly from saturation (low resistance) to cutoff (high resistance) voltage. In operation, the combination of the transistor and the output network produces a half sine wave current when the device is saturated. A high Q third harmonic resonant circuit consisting of inductor 503 and capacitor 505 makes possible a third harmonic component in the collector voltage by providing a high impedance. The presence of third harmonic voltage effectively flattens the collector voltage waveform resulting in a combination of higher efficiency and higher power output. Class F operation is characterized by a limiting of the voltage across the active device to approximately twice the DC supply voltage. A high Q resonant circuit consisting of inductor 507 and capacitor 509 is tuned to the fundamental frequency to bypass harmonics and yield a sinusoidal output signal. In this configuration, device parasitic capacitance 511 must be kept small in order to avoid shorting the high impedance presented by the resonant circuit of inductor 503 and capacitor 505 at the third harmonic. An alternative analysis considers capacitance 511 in parallel with capacitor 505 at the third harmonic and limits the range of frequencies to which the circuit of inductor 503 and parallel capacitances 505 and 511 may be made resonant.

Figure 7:
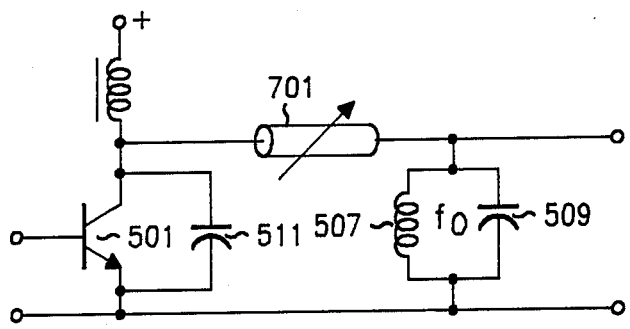
FIG. 7 is a schematic diagram of a conventional class F RF power amplifier using a fundamental frequency quarter wave line to provide a second harmonic short and a third harmonic open.

In another technique to square-up the collector voltage, a quarter wavelength transmission line, such as transmission line 701 in FIG. 7, has been used. This transmission line, when adjusted to a quarter of the fundamental wavelength, can produce the equivalent of an infinite number of resonant circuits when used with the fundamental frequency high Q tuned circuit of inductor 507 and capacitor 509. Thus, the output circuit can be tuned to have a high impedance at the odd harmonics of the fundamental and a low impedance at the even harmonics of the fundamental. It has been noted that the collector voltage contains the fundamental and odd harmonic components and the collector current contains the fundamental and even harmonic components resulting in the effective generation of power only at the fundamental frequency. Again, parasitic capacitance 511 must be small, so that its effect is negligible or compensated by shortening transmission line 701.

Past approaches to class F amplifiers run into difficulty in applications above 100 MHz, where parasitic capacitance 511 and interconnect (device package) inductance, cause a significant departure from the desired second harmonic short circuit and third harmonic open circuit impedances at the active device output terminal. In addition, these past approaches require the use of one or more high Q tuned circuits, in order to provide the desired harmonic impedances. Such high Q tuned circuits would have to be individually tuned, creating a bottleneck in a high volume production process. Furthermore, such high Q tuned circuits would contribute to a narrow bandwidth of operation.

The present invention in utilizing a novel circuit design, avoids these difficulties and enables high efficiency power amplifier operation to be extended into the microwave range of radio frequencies. In the preferred embodiment, a GaAs (gallium arsenide) MESFET field effect transistor has been employed as the active device to take advantage of the low forward resistance and fast switching speed characteristic of such a device. However, a GaAs MESFET is limited by a low gate-drain breakdown voltage at the device channel. To overcome this limitation, class F operation was chosen for the preferred embodiment because the drain voltage is limited to twice the supply voltage in an ideal implementation. The class F design approach, therefore, minimizes the drain voltage swing by forcing the drain voltage waveform to converge to a square wave as the active device and its associated output circuit is driven into saturation. In the preferred embodiment, this combination of a GaAs MESFET active device (which may be an MGF2205 available from Mitsubishi Electric, or equivalent) with a unique class F output matching network produced an output of 1.6 W from a 5V supply with a peak device efficiency of 76% at 840 MHz. A power output of at least 1.5 W with 74% device efficiency is maintained over a 50 MHz band centered at 840 MHz.

Figure 8:
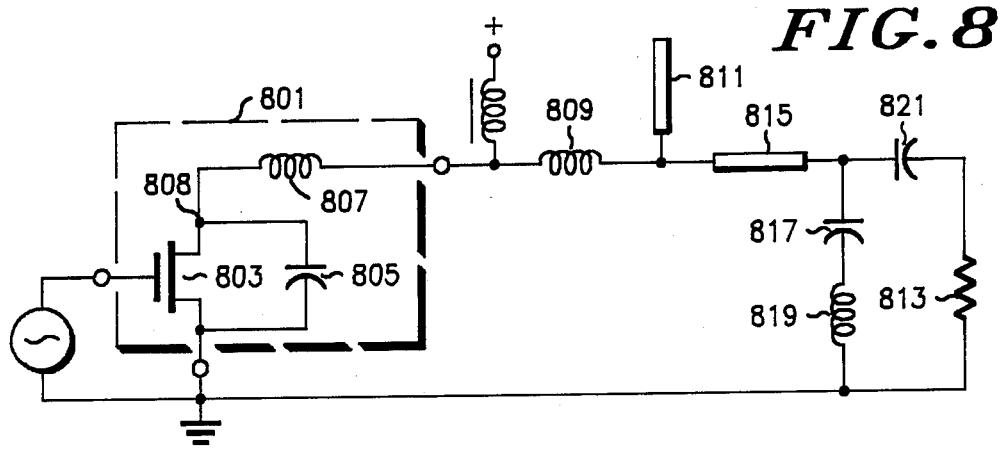
FIGS. 8 and 12 are a schematic diagram of a class F RF power amplifier utilizing the present invention.

In the realization of this performance, the inventive circuitry of FIG. 8 has been created. To account for the device parasitic reactances, the GaAs MESFET active device 801 is represented by field effect transistor 803, die capacitor 805, and interconnect inductance 807. At higher frequencies the values of die capacitance 805 and interconnect inductance 807 (which may consist of lead, package, and metalization inductance elements) become significant reactance values and adversely effect the performance of a class F amplifier. In the preferred embodiment the die capacitance 805 has a value of approximately 4 pf and the lead inductance 807 has a value of approximately 0.9 nH.

Earlier designs of class F RF power amplifiers have shown the necessity of short circuit impedance magnitude values for even harmonics of the fundamental and for open circuit impedance magnitude values at the odd harmonics. Additionally, parasitic reactances of the active device have been treated as a nuisance or totally ignored. In the present invention, these parasitics are treated as necessary elements in the creation of even harmonic shorts, and odd harmonic opens, and fundamental frequency matching. Furthermore, the utilization of device parasitics enables the proper impedances to be brought directly to the drain end of the MESFET channel, not merely to the output leads of the active device. Such utilization allows a predictability of operation which overcomes earlier notions of criticality in design of class F amplifiers.

A practical realization of optimum efficiency and bandwidth in a class F RF power amplifier, such as that of the present invention, requires an output matching circuit fulfilling the following requirements. First, it must produce high impedance at the drain end of the channel of the MESFET at the third harmonic. Second, it must produce a low impedance at the drain end of the channel of the MESFET at the second harmonic. Third, it must provide a constantly increasing impedance magnitude match at the fundamental from at least the output terminals of the MESFET die to the load. Fourth, it must provide isolation of the impedances presented to the active device from variations in load impedance at the harmonic frequencies.

Referring again to FIG. 8, to achieve a third harmonic high impedance, an external inductance 809 may be added to interconnect inductance 807 to resonate with die capacitance 805 to produce a high impedance at the third harmonic directly at the channel drain end of the active device channel (shown as output terminal 808). To achieve the requisite grounding of inductor 809 needed to produce a parallel tank circuit at the third harmonic, an open circuited transmission line 811 having an electrical length of a quarter wavelength at the third harmonic of the fundamental frequency is employed in the preferred embodiment. This transmission line 811 is preferably realized as a strip line, which has advantages to be described later. Alternately, the electrical effect of transmission line 811 may be realized by a lumped element capacitor together with its parasitic inductance which provides a short circuit at the third harmonic.

Figure 12:
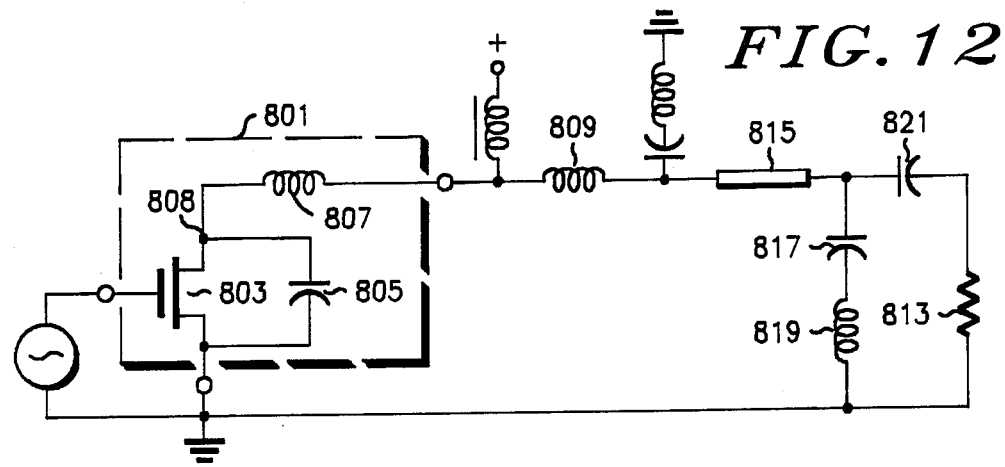

Such a lumped element capacitor and parasitic inductance are shown in FIG. 12.

A second harmonic low impedance is achieved at the channel drain by designing the capacitance of transmission line 811 to be resonant with the combined inductance of inductor 807 and inductor 809 at the second harmonic. Transmission line 811 appears as a capacitive impedance at the second harmonic since it has an electrical length of 1/6th wavelength at the second harmonic. By designing the characteristic impedance ($Z_0$) of transmission line 811 properly, the desired capacitance may be realized to produce a series resonant circuit yielding a second harmonic low impedance at the output channel drain of MESFET 801. A strip line implementation of transmission line 811 such as that employed in the preferred embodiment allows the $Z_0$ to be selected by merely adjusting the width of the conductor of the transmission line 811. Thus, according to one feature of the present invention, the width of the strip line independently determines the resonance of the circuit at the second harmonic and the length of the strip line independently determines the resonant frequency at the third harmonic.

The novel circuit of the present invention further provides fundamental impedance matching from the device 801 to the load 813. This matching circuitry, in conjunction with the second and third harmonic resonant circuits provides a constantly increasing impedance magnitude from the output of the active device die to the load, thereby reducing the Q of the output match for wide bandwidth at the fundamental frequency. Furthermore, this output match circuitry provides isolation from load variations to the second harmonic low impedance and the third harmonic high impedance at the drain. The output match section of the output circuit may be realized with a second transmission line 815 and a shunt capacitor 817 with lead inductance 819.

In the preferred embodiment operating at a center frequency of 840 MHz, the strip line transmission lines 811 and 815 were optimized at the following dimensions. Strip line 811 is designed to have a $Z_0$ of approximately 16 ohms and an electrical length of approximately 32 degrees at 840 MHz. When constructed on a copper-clad glass-teflon circuit board using 0.030 in. thick dielectric, the strip line is 0.375 in. wide by 0.83 in. long. Strip line 815 is designed to have a $Z_0$ of approximately 50 ohms and an electrical length of 22 degrees at 840 MHz. This is produced by a line 0.085 in. wide by 0.60 in. long on the same copper clad circuit board. Capacitor 817 is approximately 6pf and, in practice may be realized as a variable capacitor. Use of a variable capacitor allows the fundamental frequency impedance at the device channel to be set to the exact value needed to obtain the desired power output with optimum efficiency. Inductor 819 is approximately 1nH and represents the body inductance of capacitor 817. This inductance is a parasitic which must be accounted for in the fundamental frequency match. The parasitic inductance also improves the second harmonic isolation provided by the other matching components 815 and 817. Capacitor 821 serves to block DC current flow from the power source to the load 813. Other dimensions and component values may, of course, be generated by those skilled in the art to meet specific requirements without departing from the scope of the present invention.

Figure 9:
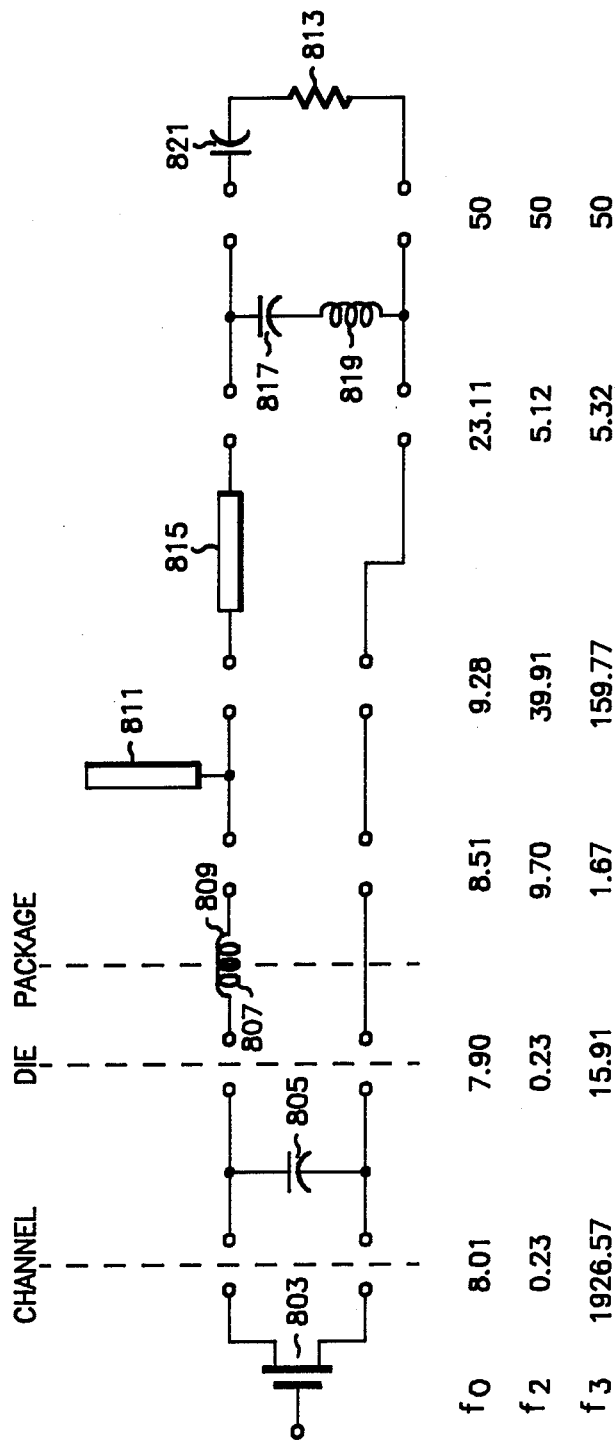
FIG. 9 is a schematic diagram of the class F RF power amplifier of FIG. 8 divided into stage by stage blocks and showing the impedance magnitude at the input of each stage for the fundamental, second harmonic, and third harmonic frequencies.

Referring, now, to FIG. 9, the progression of impedance magnitude from the active device 803 drain to the load 813 may be readily seen on an element-by-element impedance analysis. In the preferred embodiment, the impedance magnitude presented at the fundamental frequency (840 MHz to the MESFET channel drain is a matched 8.01 ohms. At the second harmonic (1680 MHz), this impedance magnitude is 0.23 ohms and at the third harmonic (2520 MHz) this impedance magnitude is 1926 ohms. Thus the output matching circuit meets the nominal requirements of class F match. It is important to observe that the impedance of the third harmonic at the output of the die (or device chip) is effectively diminished by two orders of magnitude due to the parasitic capacitance (805) of the die. Without the novel circuit of the present invention, this degradation would be uncompensated. Additionally, the impedance magnitude at the fundamental frequency constantly increases from the output terminals of the MESFET die to the load 813, thereby allowing a broadband match at the fundamental.

Figure 10:
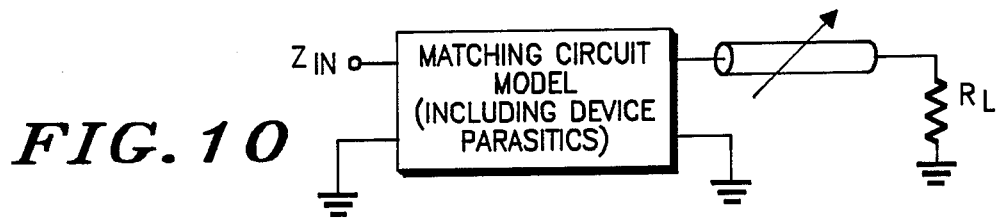
FIG. 10 is a block diagram of a test circuit for the present invention illustrating a 20:1 VSWR test.
Figure 11:
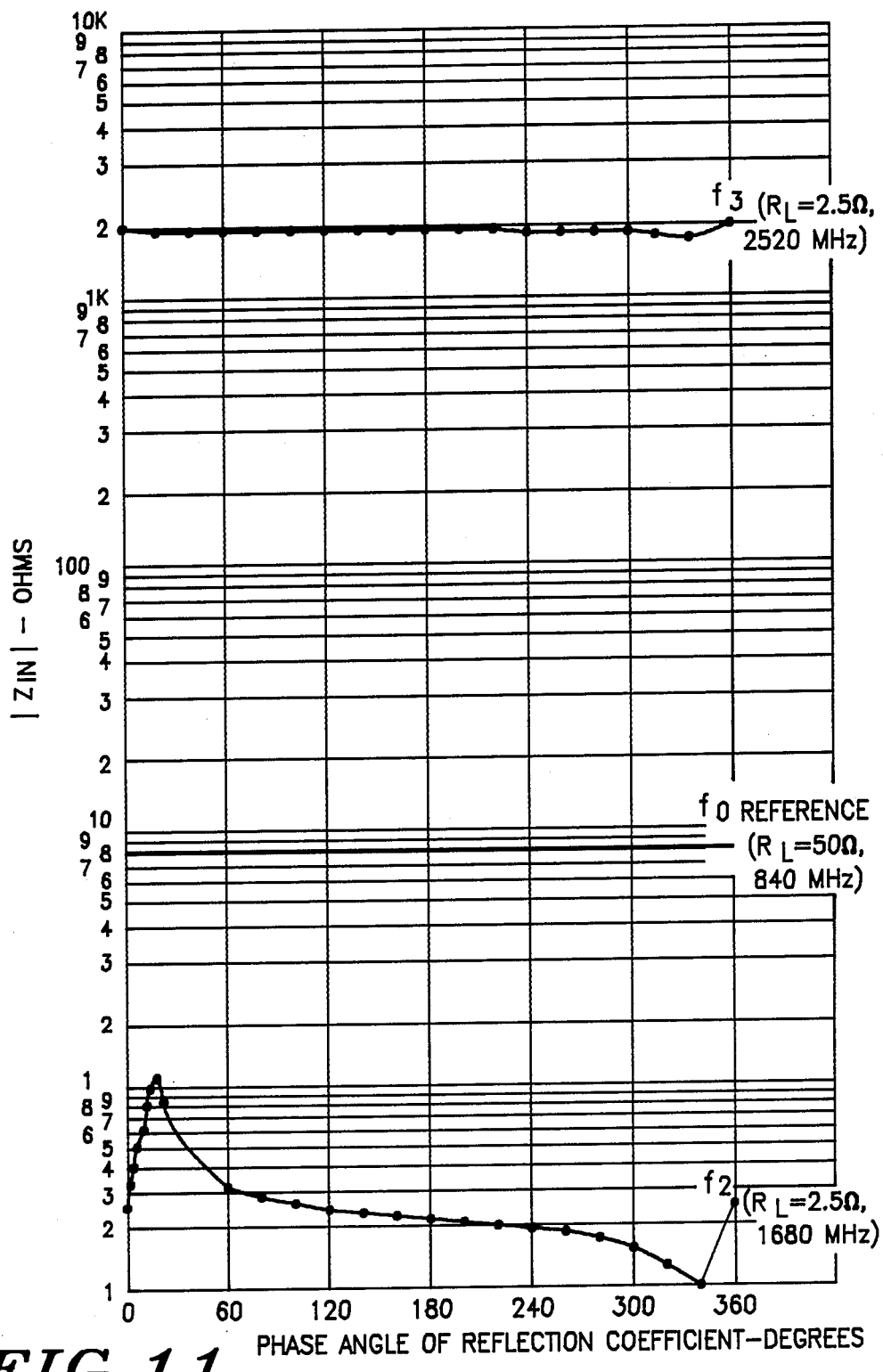
FIG. 11 is a five cycle logarithmic graph showing the effect of load mismatch on the impedance of the output circuit at the drain of the active device at the second harmonic and third harmonic frequencies with a reference line indicating the fundamental frequency impedance.

It is important that the output matching circuit provide isolation from varying load impedance, at the harmonic frequencies such as that impedance which would be created by a harmonic suppression filter. The circuit of the present invention, which is a lowpass filter, provides this isolation as shown in FIGS. 10 and 11. FIG. 10 illustrates a test circuit which introduces a 20:1 VSWR mismatched load ($R_L$) equalling a resistance of 2.5 ohms at the second and third harmonics (and a resistance of 50 ohms at the fundamental). This mismatch is coupled to the circuit of the present invention via a 50 ohm transmission line of varying length to introduce a phase angle variation of at least 360 degrees into the mismatch. The five cycle logarithmic graph of FIG. 11 illustrates the amount of isolation provided by the circuit of the present invention for load variations for the second and third harmonic frequencies. A reference impedance value is shown for the fundamental frequency to provide a relative impedance. This reference is not subjected to the mismatched load.

In summary, a high efficiency RF power amplifier circuit has been shown and described which utilizes a MESFET transistor operating in class F for low internal power losses and fast switching speed. An output matching circuit consisting of an inductor and an open circuited stripline having an electrical length of a quarter-wavelength at the third harmonic and a $Z_0$ adjusted to provide series capacitive reactance at the second harmonic produces a low impedance at the channel drain of the MESFET at the second harmonic. Parallel resonance of MESFET die capacitance and interconnect inductance coupled to ground via the open circuited stripline produces a high impedance at the drain end of the MESFET channel at the third harmonic. Additional lowpass output matching circuitry provides a constantly increasing impedance magnitude from the MESFET die impedance to the load impedance for broad bandwidth and provides load mismatch isolation to the second and third harmonic impedances at the drain. Therefore, while a particular embodiment of the invention has been shown and described, it should be understood that the invention is not limited thereto since many modifications may be made by those skilled in the art. It is therefore contemplated to cover by the present application any and all such modifications that fall within the true spirit and scope of the basic underlying principles disclosed and claimed herein.

I claim:

1. A high efficiency power amplifier for amplifying radio frequency (RF) signals from a signal source at a fundamental frequency and coupling the amplified signal to a load, comprising:
    an active device having an output terminal, disposed on a semiconductor die having interconnecting means each having inherent reactances, and being operated in class F operation;
    first means, including said interconnecting means and die reactances, for creating a substantially open circuit impedence at an odd harmonic of said fundamental frequency at said active device output terminal and for creating a substantially short circuit impedance at an even harmonic of said fundamental frequency at said active device output terminal; and
    second means, including at least a part of said first means for creating, for creating an active device to load impedance match having increasing impedance magnitude values from said semiconductor die to said load at the fundamental frequency and providing isolation from load mismatch at said even harmonic and said odd harmonic of said fundamental frequency.

2. A high efficiency power amplifier in accordance with claim 1 wherein said means for creating a substantially open circuit further comprises means for producing a parallel resonant circuit at said odd harmonic.

3. A high efficiency power amplifier in accordance with claim 2 wherein said parallel resonant circuit further comprises an open circuit quarter wave transmission line at said odd harmonic whereby at least part of said parallel resonant circuit may be coupled to a common node at said odd harmonic.

4. A high efficiency power amplifier in accordance with claim 2 wherein said parallel resonant circuit further comprises a lumped element capacitor.

5. A high efficiency power amplifier in accordance with claim 1 wherein said means for creating a substantially short circuit further comprises an open circuit transmission line of electrical length less than a quarter wavelength at said even harmonic and of a predetermined characteristic impedance ($Z_0$).

6. A high efficiency power amplifier and output matching circuitry for amplifying radio frequency (RF) signals supplied from a signal source and coupling the amplified signal to a load, comprising:
    a field effect transistor (FET) having inherent semiconductor die capacitance between drain and source and package lead inductance between drain and output terminal of said FET, said FET operated in a common source class F mode at a fundamental frequency;
    a shunt transmission line coupled to said FET output terminal and having electrical length equal to a quarter wavelength at a third harmonic of said fundamental frequency and predetermined characteristic impedance ($Z_0$) providing capacitive impedance at a second harmonic frequency whereby a parallel resonant circuit of at least said die capacitance and said lead inductance is formed at said third harmonic and a series resonant circuit of at least said lead inductance and said shunt transmission line capacitive impedance is formed at said second harmonic; and a lowpass output matching circuit coupled to said FET output terminal and said transmission line for providing fundamental frequency impedance matching from said FET output terminal to the load.

7. A high efficiency power amplifier for amplifying radio frequnency (RF) signals supplied from a signal source at a fundanmental frequency and coupling the ampifed signal to a load, comprising:

an active device having an output terminal, disposed on a semiconductor die having interconnecting means each having inherent reactances, and being operated in class F operation;

means, including said interconnecting means and die reactances, for creating a substantially opon circuit impedance at an odd harmonic of said fundamental frequency at said active device output terminal and for creating a substantially short circuit impedance at an even harmonic of said fundamental frequency at said active device output terminal; and means, including at least a part of said means for creating, for providing isolation from load mismatch at said even harmonic and said odd harmonic of said fundamental frequency, and having increasing impedance magnitude values from said semiconductor die to said load at the fundamental frequency.

8. A high efficiency power amplifier in accordance with claim 7 wherein said means for creating a substantially open circuit further comprises means for producing a parallel resonant circuit at said odd harmonic.

9. A high efficiency power amplifier in accordance with claim 8 wherein said parallel resonant circuit further comprises an open circuit quarter wave transmission line at said odd harmonic whereby at least part of said parallel resonant circuit may be coupled to a common node at said odd harmonic.

10. A high efficiency power amplifier in accordance with claim 8 wherein said parallel resonant circuit further comprises a lumped element capacitor.

11. A high efficiency power amplifier in accordance with claim 7 wherein said means for creating a substantially short circuit further comprises an open circuit transmission line of electrical length less than a quarter wavelength at said even harmonic and of a predetermined characteristic impedance ($Z_0$).

* * * * *

UNITED STATES PATENT AND TRADEMARK OFFICE
CERTIFICATE OF CORRECTION

PATENT NO. : 4,717,884

DATED : January 5, 1988

INVENTOR(S) : James Edward Mitzlaff

It is certified that error appears in the above-identified patent and that said Letters Patent is hereby corrected as shown below:

Claim 1, line 13, after "signals" insert --supplied--.

Claim 7, line 18, "fundanmental" should be --fundamental--.

Claim 7, line 25, "opon" should be --open--.

Signed and Sealed this

Second Day of August, 1988

Attest:

Attesting Officer

DONALD J. QUIGG

Commissioner of Patents and Trademarks